United States Patent
Jagannathan et al.

(10) Patent No.: US 8,680,629 B2
(45) Date of Patent: Mar. 25, 2014

(54) CONTROL OF FLATBAND VOLTAGES AND THRESHOLD VOLTAGES IN HIGH-K METAL GATE STACKS AND STRUCTURES FOR CMOS DEVICES

(75) Inventors: Hemanth Jagannathan, Guilderland, NY (US); Takashi Ando, Tuckahoe, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 12/477,536

(22) Filed: Jun. 3, 2009

(65) Prior Publication Data
US 2010/0308412 A1  Dec. 9, 2010

(51) Int. Cl.
*H01L 21/71*  (2006.01)

(52) U.S. Cl.
USPC .... 257/407; 257/369; 257/410; 257/E29.255; 257/E27.062; 257/E21.19; 438/59

(58) Field of Classification Search
None
See application file for complete search history.

(56) References Cited

U.S. PATENT DOCUMENTS

| | | | |
|---|---|---|---|
| 6,281,559 B1 | 8/2001 | Yu et al. | |
| 6,310,367 B1 * | 10/2001 | Yagishita et al. | 257/190 |
| 6,468,888 B1 | 10/2002 | Yu | |
| 6,780,741 B2 | 8/2004 | Chen et al. | |
| 6,828,181 B2 | 12/2004 | Chen et al. | |
| 6,861,712 B2 | 3/2005 | Gao et al. | |
| 6,894,357 B2 | 5/2005 | Guo | |
| 7,105,889 B2 | 9/2006 | Bojarczuk, Jr. et al. | |
| 7,145,167 B1 | 12/2006 | Chu | |
| 7,151,023 B1 | 12/2006 | Nayfeh et al. | |
| 7,226,832 B2 | 6/2007 | Yeo et al. | |
| 7,291,519 B2 * | 11/2007 | Bhattacharyya | 438/149 |
| 7,297,618 B1 | 11/2007 | Henson et al. | |
| 7,354,848 B2 | 4/2008 | Paranjpe et al. | |
| 7,728,387 B1 | 6/2010 | Krishnamohan et al. | |
| 2001/0002709 A1 * | 6/2001 | Wallace et al. | 257/296 |
| 2002/0096994 A1 * | 7/2002 | Iwafuchi et al. | 313/495 |
| 2004/0043569 A1 * | 3/2004 | Ahn et al. | 438/287 |
| 2004/0142579 A1 | 7/2004 | Morita et al. | |
| 2004/0256662 A1 * | 12/2004 | Black et al. | 257/317 |
| 2005/0045938 A1 * | 3/2005 | Mutou et al. | 257/310 |
| 2005/0161663 A1 * | 7/2005 | Atanackovic | 257/19 |
| 2005/0258468 A1 * | 11/2005 | Colombo et al. | 257/314 |

(Continued)

FOREIGN PATENT DOCUMENTS

EP  1 833 094  12/2007

OTHER PUBLICATIONS

S. Jakschik, et al., "A 50nm high-k poly silicon gate stack with a buried SiGe channel", IEEE, 2007, 2 pages.

(Continued)

*Primary Examiner* — Fei Fei Yeung Lopez
(74) *Attorney, Agent, or Firm* — Cantor Colburn LLP; Vazken Alexanian

(57) ABSTRACT

A high-k metal gate stack and structures for CMOS devices and a method for forming the devices. The gate stack includes a high-k dielectric having a high dielectric constant greater than approximately 3.9, a germanium (Ge) material layer interfacing with the high-k dielectric, and a conductive electrode layer disposed above the high-k dielectric or the Ge material layer. The gate stack optimizes a shift of the flatband voltage or the threshold voltage to obtain high performance in p-FET devices.

9 Claims, 11 Drawing Sheets

(56) References Cited

U.S. PATENT DOCUMENTS

| | | |
|---|---|---|
| 2005/0269635 A1* | 12/2005 | Bojarczuk et al. ............ 257/338 |
| 2006/0131672 A1 | 6/2006 | Wang et al. |
| 2006/0131675 A1 | 6/2006 | Wang et al. |
| 2006/0244035 A1 | 11/2006 | Bojarczuk, Jr. et al. |
| 2006/0289948 A1 | 12/2006 | Brown et al. |
| 2007/0045718 A1* | 3/2007 | Bhattacharyya ............. 257/324 |
| 2007/0048919 A1* | 3/2007 | Adetutu et al. ............... 438/199 |
| 2007/0057347 A1* | 3/2007 | Ikeda ............................ 257/616 |
| 2007/0090471 A1* | 4/2007 | Cartier et al. ................. 257/411 |
| 2007/0132010 A1* | 6/2007 | Bhattacharyya ............. 257/324 |
| 2007/0138565 A1* | 6/2007 | Datta et al. ................... 257/369 |
| 2008/0064156 A1 | 3/2008 | Ikeda |
| 2008/0224238 A1 | 9/2008 | Kanakasabapathy et al. |
| 2009/0108368 A1* | 4/2009 | Kanegae et al. ............. 257/369 |
| 2009/0302390 A1* | 12/2009 | Van Dal et al. .............. 257/369 |
| 2010/0264495 A1 | 10/2010 | Mo et al. |

OTHER PUBLICATIONS

H. Rusty Harris, et al., "Band-Engineered Low PMOS VT with High-K/Metal Gates Featured in a Dual Channel CMOS Integration Scheme", 2007 Symposium on VLSI Technology Digest of Technical Papers, pp. 154-155.

E. F. Crabbe et al., "Planar Fully-Integrated Bulk/SOI SiGe CMOS Fabrication Process" IBM Technical Disclosure Bulletin; Mar. 1992, pp. 128-129, vol. 34, No. 10A.

P.W. Liu et al., "SiGe Channel CMOSFETs Fabricated on (110) Surfaces with TaC/HfO2 Gate Stacks," VLSI-TSA, IEEE, 2007.

U.S. Appl. No. 12/619,209; Final Office Action, filed Nov. 16, 2009; Date Mailed: Feb. 1, 2012; pp. 1-10.

* cited by examiner

CONTROL OF FLATBAND VOLTAGES AND THRESHOLD VOLTAGES IN HIGH-K METAL GATE STACKS AND STRUCTURES FOR CMOS DEVICES

BACKGROUND

The present invention relates to a semiconductor structure, and more specifically, to a material stack which is capable of providing a shift in flatband and threshold voltages in high-k gate stacks and CMOS devices, particularly, p-FET devices.

The use of silicon-germanium (SiGe) as the channel of a p-FET device has been shown to reduce the flatband and threshold voltage to the p-FET band edge. The shift in flatband and threshold voltage has been associated with the band-gap modulation of the SiGe layer with respect to silicon. However, the total shift that is obtained in these devices is not consistent with only band-gap narrowing.

Several methods have been employed to control the threshold voltage and flatband voltage in p-FET devices having a SiGe layer. One method includes increasing the Ge concentration of the SiGe layer. Another method includes increasing the thickness of the SiGe layer. Several problems may occur using these methods. One problem is that the increase of the Ge concentration limits the thickness of the growth layer to obtain a defect free film. Furthermore, the increase in thickness of the SiGe channel limits the Ge concentration that can be obtained. Therefore, the maximum voltage shift is limited by maximum tolerance to defects during manufacturing of the p-FET device.

In view of the above-mentioned problems, there is a need for providing a method and structure capable of controlling flatband and threshold voltages in a high-k metal gate stack by eliminating the use of a SiGe layer, and introducing a Ge material layer and tuning the interface, thickness and location of the Ge material layer in the high-k metal gate stack.

SUMMARY

The present invention provides a gate metal stack structure that optimizes a shift of the flatband voltages and threshold voltages of material stacks that include a high-k dielectric, by introducing a Ge material layer into the material stack, on top of or beneath the high-k dielectric.

According to one embodiment of the present invention, a material stack formed on a semiconductor substrate of a semiconductor structure is disclosed. The material stack includes a high-k dielectric having a high dielectric constant greater than approximately 3.9, a germanium (Ge) material layer disposed interfacing with the high-k dielectric, and a conductive electrode layer disposed above the high-k dielectric or the Ge material layer.

According to another embodiment of the present invention, a semiconductor structure is disclosed. The semiconductor structure includes a patterned material stack disposed on a surface of a semiconductor substrate. The patterned material stack includes a high-k dielectric having a high dielectric constant greater than approximately 3.9, a germanium (Ge) material layer interfacing with the high-k dielectric, and a conductive electrode layer located above the high-k dielectric or the Ge material layer.

According to yet another embodiment of the present invention, a semiconductor structure is disclosed. The semiconductor structure includes a first semiconductor device having a first patterned material stack disposed on a semiconductor substrate, and a second semiconductor device having a second patterned material stack disposed on the semiconductor substrate. The first patterned material stack and the second patterned material stack each include a high-k dielectric having a high dielectric constant greater than approximately 3.9, at least one of a metal oxide or nitride layer, or a Ge material layer interfacing with the high-k dielectric, and a conductive electrode layer disposed above the high-k dielectric or the Ge material layer, or the metal oxide or nitride layer.

According to yet another embodiment of the present invention, a semiconductor structure is disclosed. The semiconductor structure includes a patterned material stack disposed on a surface of a semiconductor substrate. The patterned material stack includes a high-k dielectric having a high dielectric constant greater than approximately 3.9, and a germanium (Ge)-containing metal electrode interfacing with the high-k dielectric.

According to yet another embodiment of the present invention, a method of forming a semiconductor structure having a first semiconductor device including a first patterned material stack and a second semiconductor device including a second patterned material stack. The method includes providing a semiconductor substrate, forming a high-k dielectric having a high dielectric constant greater than approximately 3.9, forming a metal oxide or nitride layer in the first patterned material stack interfacing with the high-k dielectric, forming a Ge material layer in the second patterned material stack interfacing with the high-k dielectric, and forming a conductive electrode layer above the high-k dielectric, the Ge material layer, or the metal oxide or nitride layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
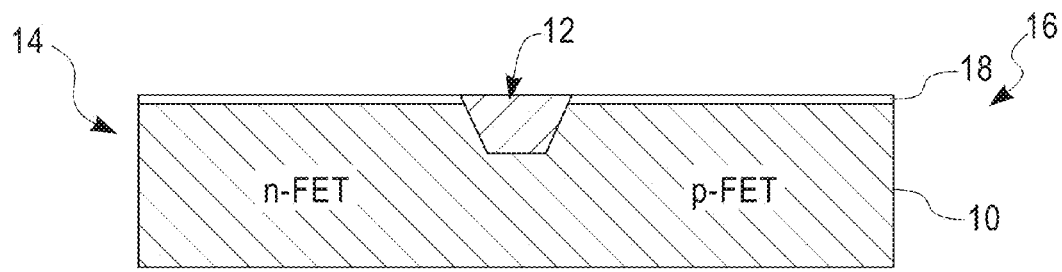
FIGS. 1A-1H are cross-sectional views of pictorial representations illustrating the basic processing steps that are employed in the present invention for forming a material stack that can be implemented within embodiments of the present invention.

Reference is made to FIGS. 1A-1H, which are pictorial representations of basic fabrication steps that may be used to form the inventive material stack on the surface of a semiconductor substrate according to an embodiment of the present invention. With reference now to FIG. 1A, a semiconductor substrate 10 including a semiconducting material such as silicon (Si) is formed and includes at least one isolation region 12. The isolation region 12 may be a shallow trench isolation (STI) region formed by lithography, etching, and filling of the trench with a trench dielectric, for example. The isolation region 12 provides isolation between adjacent semiconductor device components e.g., a n-type field effect transistor (n-FET) device 14 and a p-type field effect transistor (p-FET) device 16 as shown in FIG. 1A. After processing the semiconductor substrate 10, an interface preparation layer 18, e.g., a chemical oxidation (chemox) layer, is formed on the surface of the semiconductor substrate 10. The interface preparation layer 18 is an optional interfacial dielectric that prepares the surface of the semiconductor substrate 10 for a dielectric layer (to be described below with reference to FIG. 1D). The interface preparation layer 18 may be an oxide or nitride layer formed by an oxidation or oxynitridation process, for example.

Figure 1B:
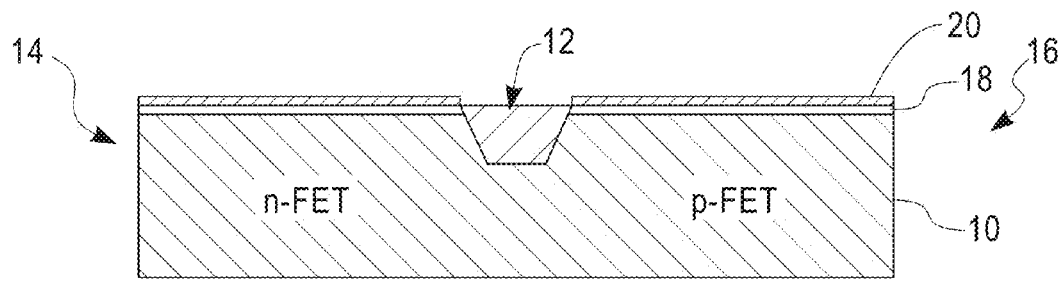

In FIG. 1B, a Ge material layer 20 is deposited on the interface preparation layer 18. According to an exemplary embodiment of the present invention, the Ge material layer includes germanium (Ge) and any compounds thereof, or any like material which produces a shift towards the threshold voltage of the p-FET device 16. According to an embodiment, the fraction of germanium within the Ge material layer 20 may be up to 100%. According to the current exemplary embodiment, the Ge material layer 20 includes a thickness which is less than or equal to approximately 2 nanometers (nm). The Ge material layer 20 may be deposited utilizing a deposition process such as diffusion, co-deposition, chemical vapor deposition (CVD), physical vapor deposition (PVD), molecular beam epitaxy (MBE), plasma-enhanced chemical vapor deposition (PECVD), atomic layer deposition (ALD), evaporation, sputtering or implantation, for example.

Figure 1C:
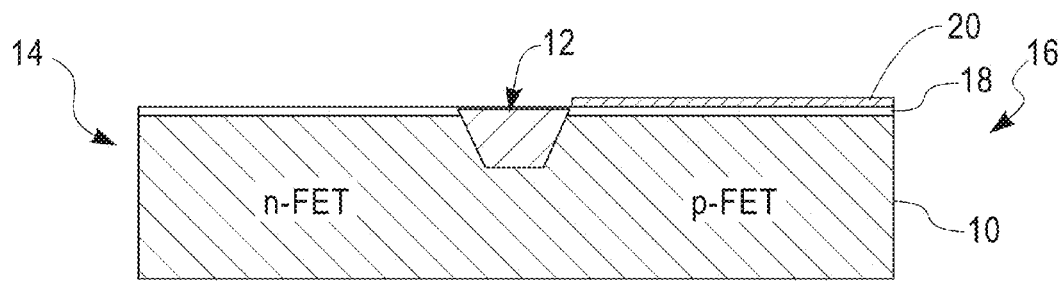
Figure 5:
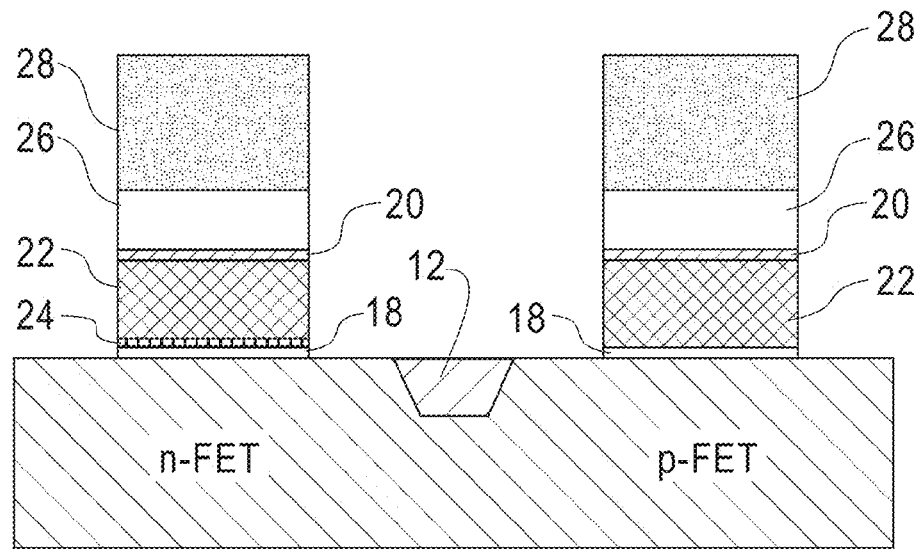
FIG. 5 is a cross-sectional view of a pictorial representation illustrating a semiconductor structure that can be implemented within alternative embodiments of the present invention.

Referring to FIG. 1C, according to an embodiment of the present invention, the Ge material layer 20 is then selectively removed from the n-FET device 14 to prevent a shift in voltage at the n-FET device 14 while producing a shift in the threshold voltage towards the band edge for the p-FET device 16. Alternatively, the Ge material layer 20 may remain on the n-FET device 14 (as depicted in FIG. 5, for example).

Figure 1D:
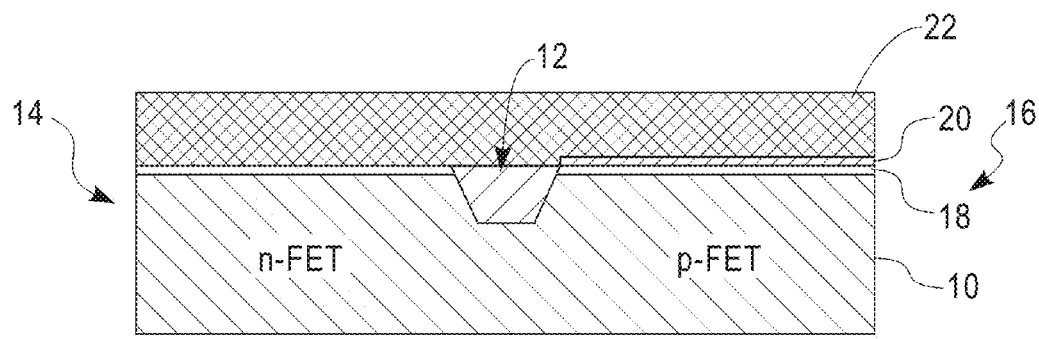

In FIG. 1D, a "high-k" dielectric 22 that is a material having a high dielectric constant (κ) greater than approximately 3.9 is formed on the surface of the interface preparation layer 18 at the n-FET device 14 and on the Ge material layer 20 formed at the p-FET device 16, by a deposition process such as, for example, CVD, PVD, ALD, evaporation, reactive sputtering, or other like deposition processes. The thickness of the high-k dielectric 22 ranges from approximately 0.5 to approximately 3 nm, for example.

Figure 1E:
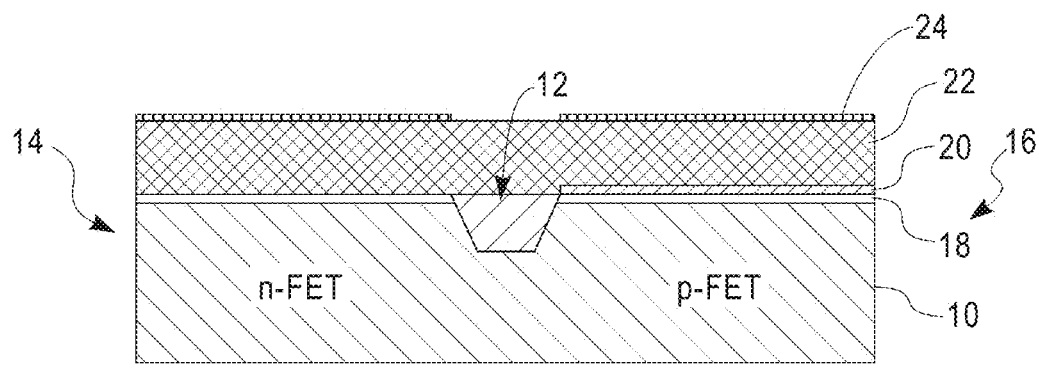
Figure 1F:
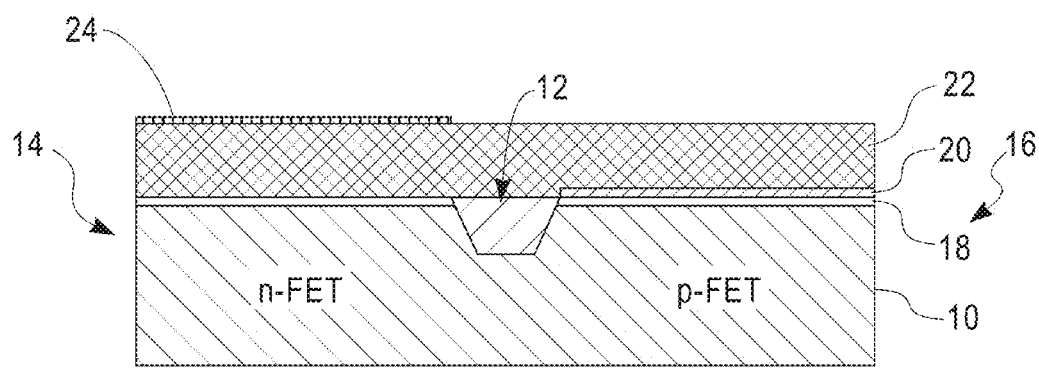

Once the structure shown in FIG. 1D is formed, a metal oxide or nitride layer 24 is then formed on the high-k dielectric 22 as shown in FIG. 1E. The metal oxide or nitride layer 24 may include an alkaline or a rare earth metal-containing material (such as in Group IIA or IIIB), for example. According to one embodiment, the metal oxide or nitride layer 24 is used for the purpose of stabilizing the threshold voltage and flatband voltage at the n-FET device 14. Thus, as shown in FIG. 1F, according to one embodiment, the metal oxide or nitride layer 24 is removed from the p-FET device 16. However, the present invention is not limited hereto, and may vary accordingly. Alternative embodiments are described below with reference to FIGS. 3-7.

Figure 1G:
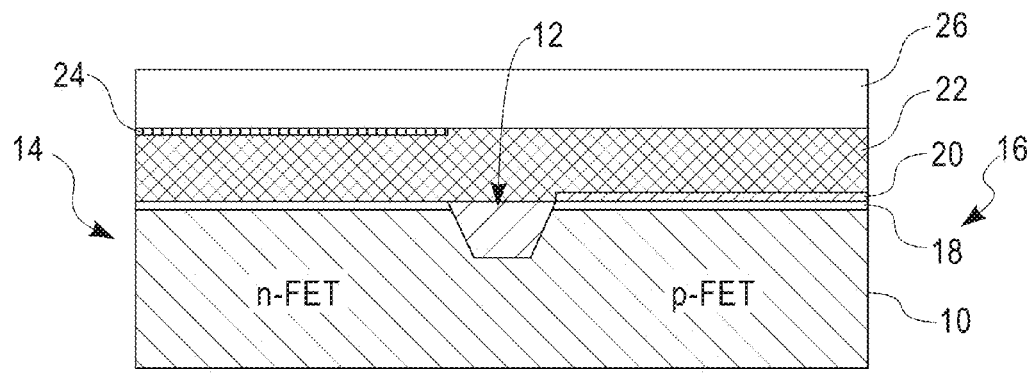

Next, as shown in FIG. 1G, a conductive electrode layer 26 is formed on the surface of the metal oxide or nitride layer 24 on the n-FET device 14 and directly on the high-k dielectric formed on the p-FET device 16. The conductive electrode layer 26 includes a metallic material. The conductive electrode layer 26 is formed by a deposition process such as CVD, PVD, ALD, sputtering or evaporation.

Figure 1H:
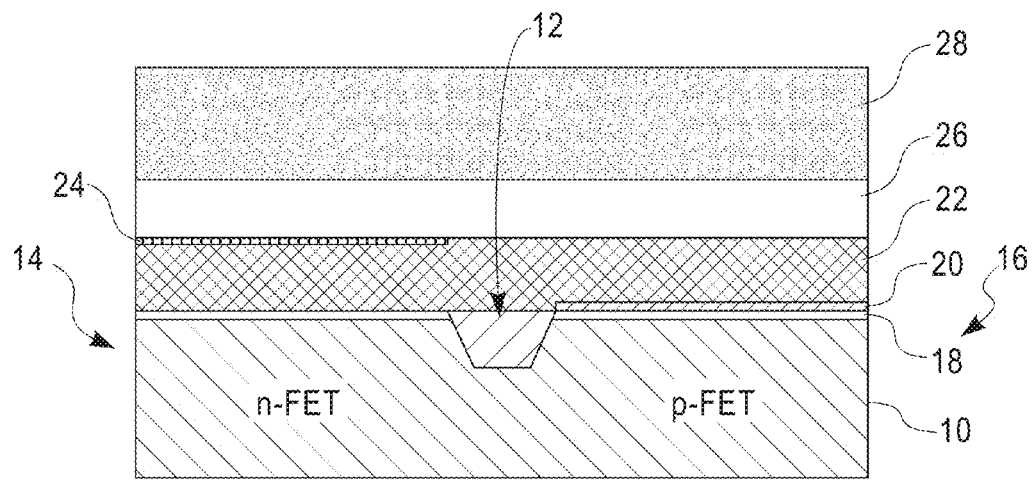

Following the formation of the conductive electrode layer 26 as shown in FIG. 1G, according to one embodiment as shown in FIG. 1H, a conductive layer 28 is formed on top of the conductive electrode layer 26 to form a resultant inventive material stack. The conductive layer 28 is formed using a deposition process such as CVD, PVD or evaporation, for example. According to an embodiment, the conductive layer 28 includes a Si-containing conductor or a metallic conductive layer such as polysilicon, for example.

Figure 2:
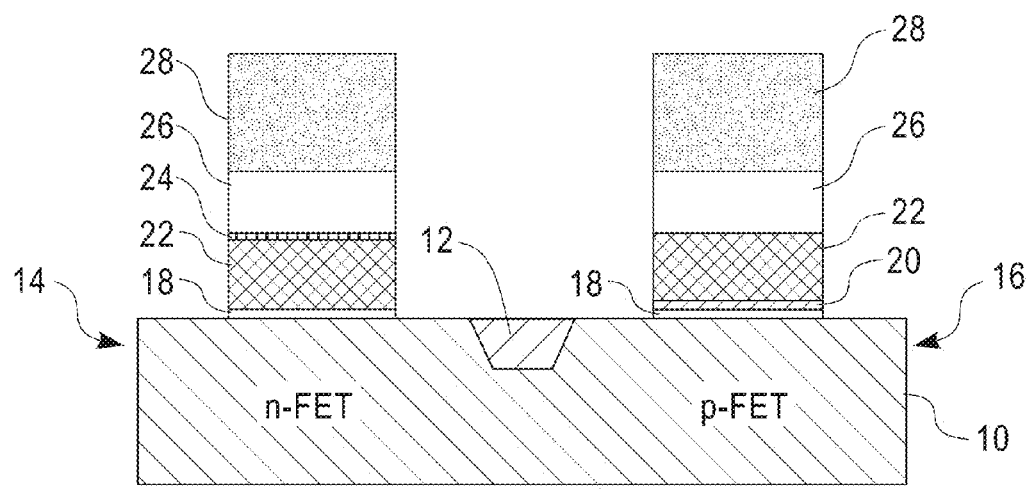
FIG. 2 is a cross-sectional view of a pictorial representation illustrating a semiconductor structure including the material stack as shown in FIG. 1H that can be implemented within embodiments of the present invention.

According to an exemplary embodiment, as shown in FIG. 2, the inventive material stack i.e., gate stack structure shown in FIG. 1H may then be fabricated into the CMOS structure.

As shown in FIG. 2, the gate stack structure is patterned by etching to define gates for the n-FET device 14 and the p-FET device 16. According to the current exemplary embodiment, as shown in FIG. 2, the inventive material stack formed on the p-FET device 16 includes the Ge material layer 20 formed beneath the high-k dielectric 22. However, the present invention is not limited hereto. According to an alternative exemplary embodiment, the Ge material layer 20 may be formed on top of the high-k dielectric 22 as shown in FIG. 4 discussed below, for example. As mentioned above, the present invention is not limited to the Ge material layer 20 and/or the metal oxide or nitride layer 24 being formed in any particular order, and may vary accordingly. Alternative embodiments will now be described with reference to FIGS. 3-7. Some of the features shown in FIGS. 3-7 are the same as those shown in FIG. 2; therefore, a detailed description thereof is omitted.

According to the following embodiments shown in FIGS. 3-7, the semiconductor structure includes a first semiconductor device, e.g., the n-FET device 14, having a first patterned material stack, and a second semiconductor device, e.g., the p-FET device 16 having a second patterned material stack. The first patterned material stack and the second patterned material stack each include the high-k dielectric 22, at least one of a metal oxide or nitride layer 24, or a Ge material layer 20 interfacing with the high-k dielectric 22, and the conductive electrode layer 26 disposed above the high-k dielectric 22, the Ge material layer 20, or the metal oxide or nitride layer 24, and the optional conductive layer 28 formed on top of the conductive electrode layer 26.

Figure 3:
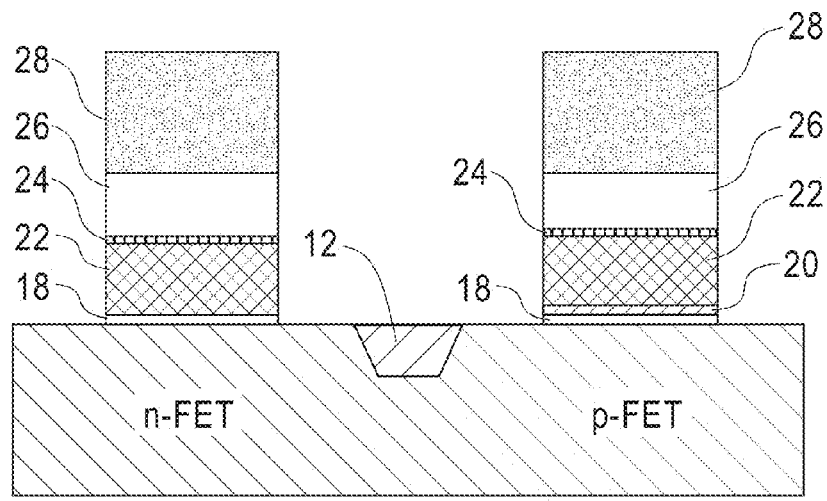
FIG. 3 is a cross-sectional view of a pictorial representation illustrating a semiconductor structure that can be implemented within alternative embodiments of the present invention.
Figure 4:
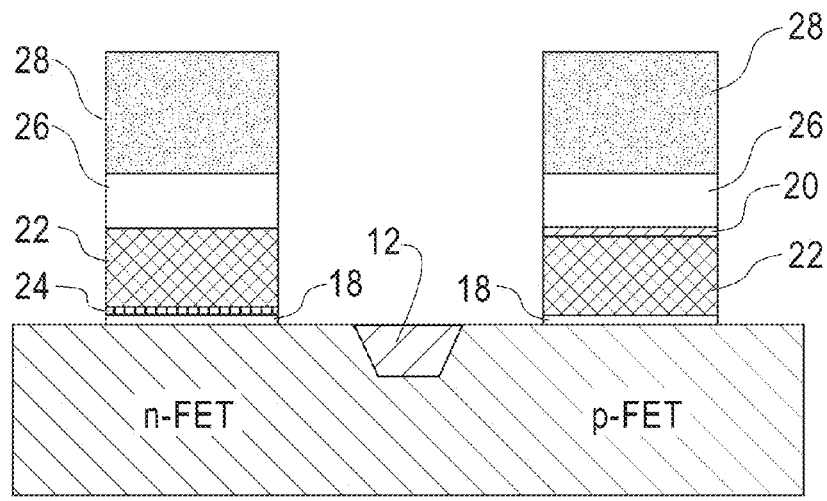
FIG. 4 is a cross-sectional view of a pictorial representation illustrating a semiconductor structure that can be implemented within alternative embodiments of the present invention.

As shown in FIG. 3, the first patterned material stack of the n-FET device 14 includes the metal oxide or nitride layer 24 disposed above the high-k dielectric 22, and the second patterned material stack of the p-FET device 16 includes the Ge material layer 20 disposed below the high-k dielectric 22 and the metal oxide or nitride layer 24 disposed above the high-k dielectric 22.

According to another embodiment, as shown in FIG. 4, the first patterned material stack includes the metal oxide or nitride layer 24 disposed below the high-k dielectric 22 and the second patterned material stack includes the Ge material layer 20 disposed above the high-k dielectric 22.

According to another embodiment, as shown in FIG. 5, the first patterned material stack includes the metal oxide or nitride layer 24 disposed below the high-k dielectric 22 and the Ge material layer 20 disposed above the high-k dielectric 24, and the second patterned material stack includes the Ge material layer 20 disposed above the high-k dielectric 22.

Figure 6:
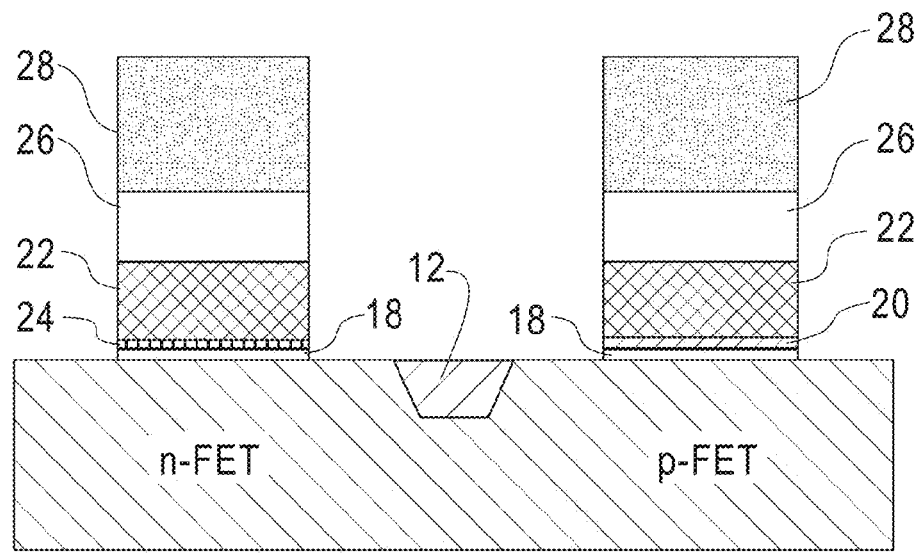
FIG. 6 is a cross-sectional view of a pictorial representation illustrating a semiconductor structure that can be implemented within alternative embodiments of the present invention.

According to another embodiment, as shown in FIG. 6, the first patterned material stack includes the metal oxide or nitride layer 24 disposed below the high-k dielectric 22, and the second patterned material stack includes the Ge material layer 20 disposed below the high-k dielectric 22.

Figure 7:
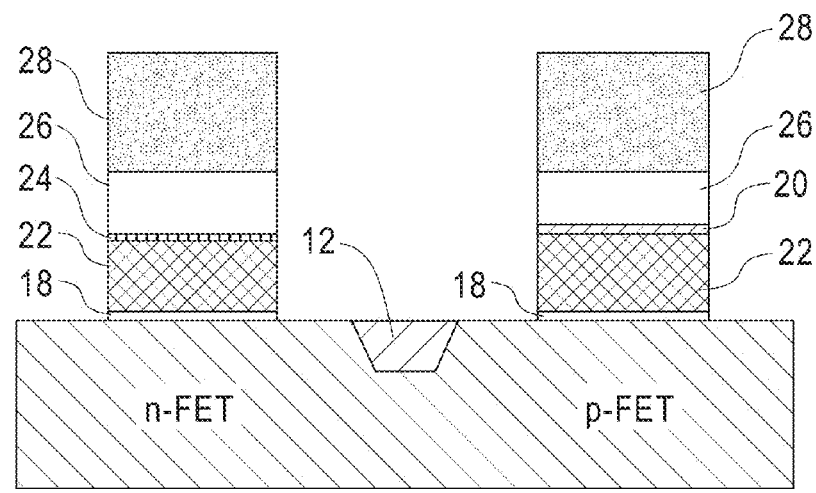
FIG. 7 is a cross-sectional view of a pictorial representation illustrating a semiconductor structure that can be implemented within alternative embodiments of the present invention.

According to yet another embodiment, as shown in FIG. 7, the first patterned material stack includes the metal oxide or nitride layer 24 disposed above the high-k dielectric 22, and the second patterned material stack includes the Ge material layer 20 disposed above the high-k dielectric 22.

An ion implantation and annealing process for the gate stack structures shown in FIGS. 2-7 will now be described below in reference to FIGS. 8-13, respectively. Some of the features shown in FIGS. 8-13 are the same, and therefore a detailed description thereof is omitted.

Figure 8:
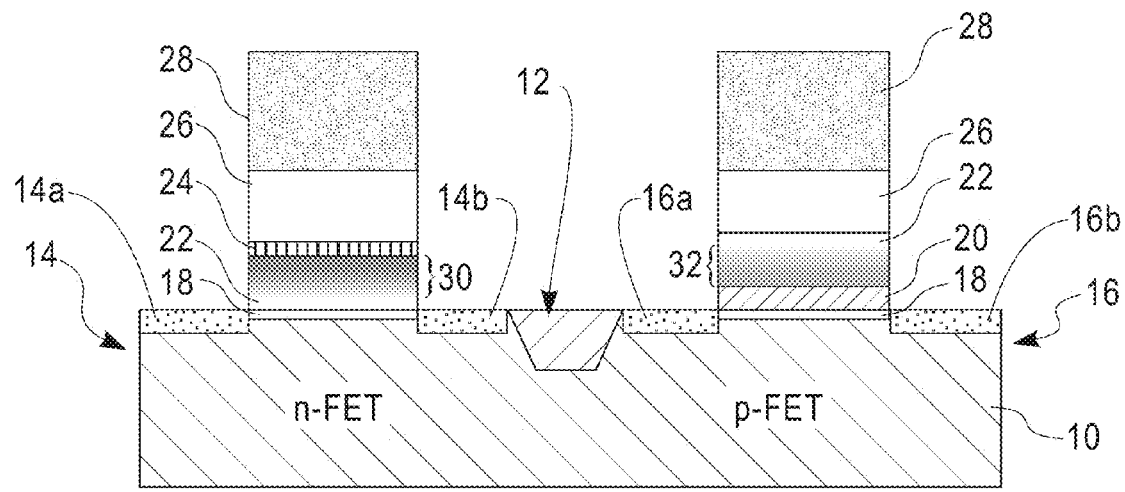
FIG. 8 is cross-sectional view of a pictorial representation illustrating an ion implantation and activation for an n-FET and p-FET structure as shown in FIG. 2 that can be implemented with embodiments of the present invention.

As shown in FIG. 8, diffusion regions 30 and 32 are formed in the gate stack structure using ion implantation and annealing process. As can be seen in FIG. 8, the diffusion region 30 shown at the gate stack of the n-FET device 14 is formed when the metal oxide or nitride layer 24 disposed above the high-k dielectric 22 moves down into the high-k dielectric 22, and the diffusion region 32 shown at the gate stack of the p-FET device 16 is formed when the Ge material layer 20 disposed below the high-k dielectric 22 moves up into the high-k dielectric 22. Further, source regions 14a and 16b and drain regions 14b and 16a are formed on n-FET device 14 and the p-FET device 16, respectively.

Figure 9:
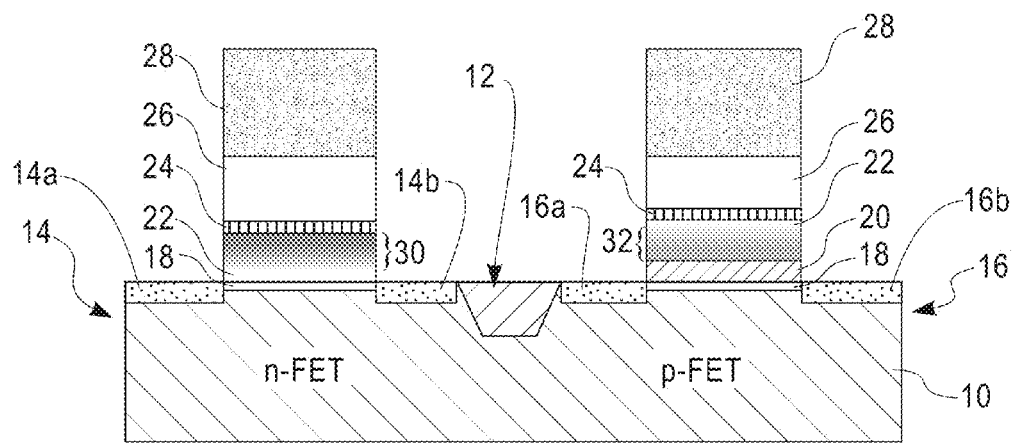
FIG. 9 is cross-sectional view of a pictorial representation illustrating an ion implantation and activation for an n-FET and p-FET structure as shown in FIG. 3 that can be implemented with embodiments of the present invention.

As shown in FIG. 9, the diffusion region 30 shown at the gate stack of the n-FET device 14, is formed when the metal oxide or nitride layer 24 disposed above the high-k dielectric 22 moves down into the high-k dielectric 22, and the diffusion region 32 shown at the gate stack of the p-FET device 16 is formed when the Ge material layer 20 disposed below the high-k dielectric 22 and the metal oxide or nitride layer 24 disposed above the high-k dielectric both move into the high-k dielectric 20.

Figure 10:
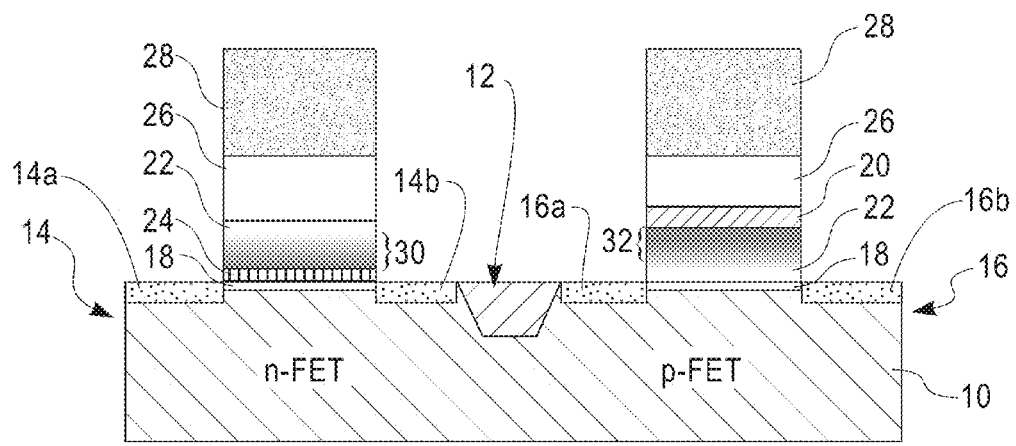
FIG. 10 is cross-sectional view of a pictorial representation illustrating an ion implantation and activation for an n-FET and p-FET structure as shown in FIG. 4 that can be implemented with embodiments of the present invention.

As shown in FIG. 10, the diffusion region 30 shown at the gate stack of the n-FET device 14 is formed when the metal oxide or nitride layer 24 disposed below the high-k dielectric 22 moves up into the high-k dielectric 22, and the diffusion region 32 shown at the gate stack of the p-FET device 16 is formed when the Ge material layer 20 disposed above the high-k dielectric 22 moves down into the high-k dielectric 22.

Figure 11:
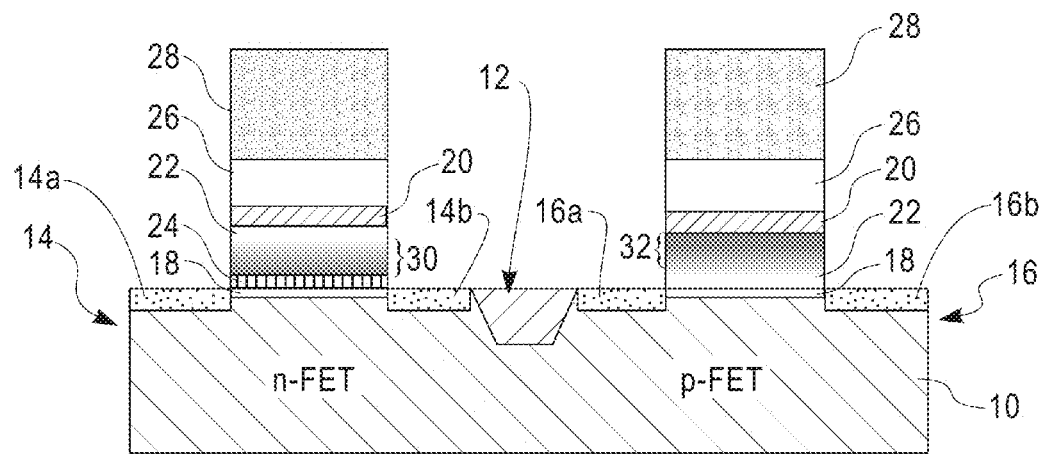
FIG. 11 is cross-sectional view of a pictorial representation illustrating an ion implantation and activation for an n-FET and p-FET structure as shown in FIG. 5 that can be implemented with embodiments of the present invention.

As shown in FIG. 11, the diffusion region 30 shown at the gate stack of the n-FET device 14, is formed when the metal oxide or nitride layer 24 disposed below the high-k dielectric 22 and the Ge material layer 20 disposed above the high-k dielectric 22 both move into the high-k dielectric 22, and the diffusion region 32 shown at the gate stack of the p-FET device 16 is formed when the Ge material layer 20 disposed above the high-k dielectric 22 moves into the high-k dielectric 22.

Figure 12:
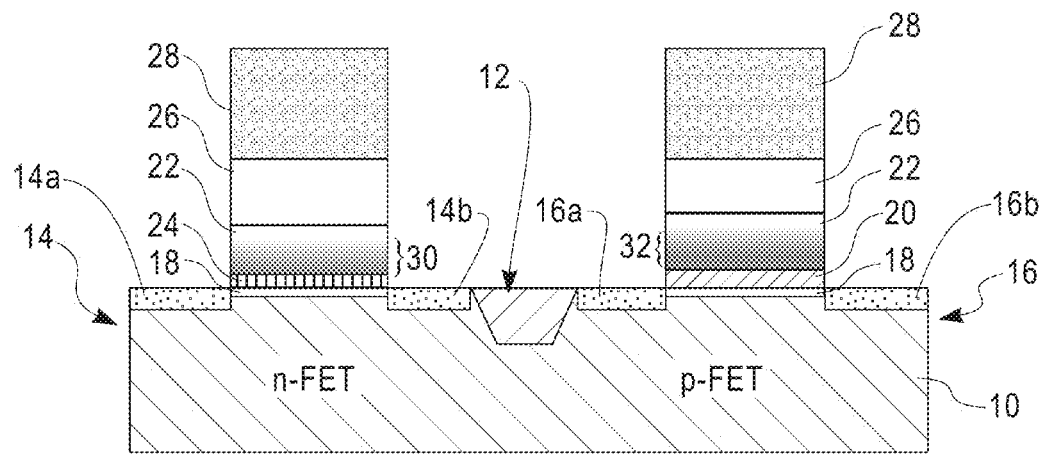
FIG. 12 is cross-sectional view of a pictorial representation illustrating an ion implantation and activation for an n-FET and p-FET structure as shown in FIG. 6 that can be implemented with embodiments of the present invention.

As shown in FIG. 12, the diffusion region 30 shown at the gate stack of the n-FET device 14, is formed when the metal oxide or nitride layer 24 disposed below the high-k dielectric 22 moves up into the high-k dielectric 22, and the diffusion region 32 shown at the gate stack of the p-FET device 16 is formed when the Ge material layer 20 disposed below the high-k dielectric 22 moves up into the high-k dielectric 22.

Figure 13:
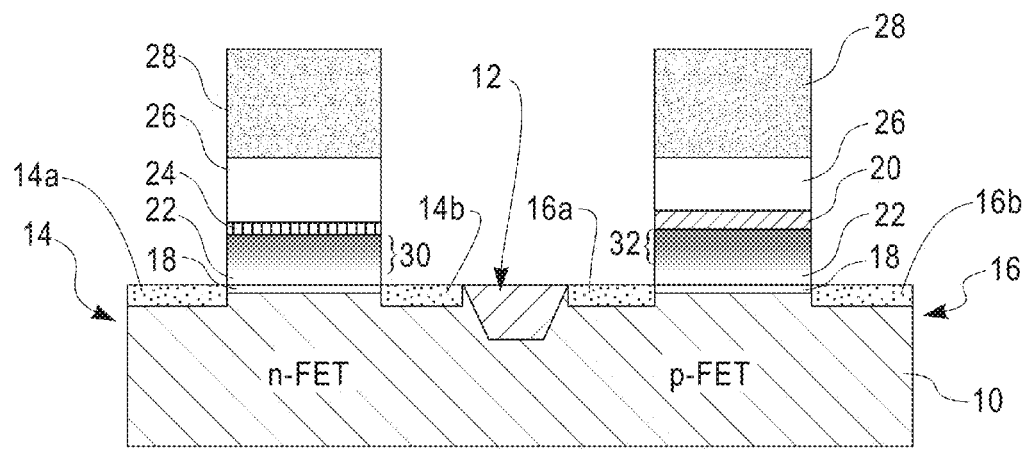
FIG. 13 is cross-sectional view of a pictorial representation illustrating an ion implantation and activation for an n-FET and p-FET structure as shown in FIG. 7 that can be implemented with embodiments of the present invention.

As shown in FIG. 13, the diffusion region 30 shown at the gate stack of the n-FET device 14, is formed when the metal oxide or nitride layer 24 formed above the high-k dielectric 22 moves down into the high-k dielectric 22, and the diffusion region 32 shown at the gate stack of the p-FET device 16 is formed when the Ge material layer 20 formed above the high-k dielectric 22 moves down into the high-k dielectric 22. As shown in FIGS. 8-13, according to embodiments of the present invention, the diffusion regions 30 and 32 are formed based on the inclusion and disposition of the metal oxide or nitride layer 24 and/or the Ge material layer 20 in the gate stacks of the n-FET device 14 and the p-FET device 26.

Figure 14:
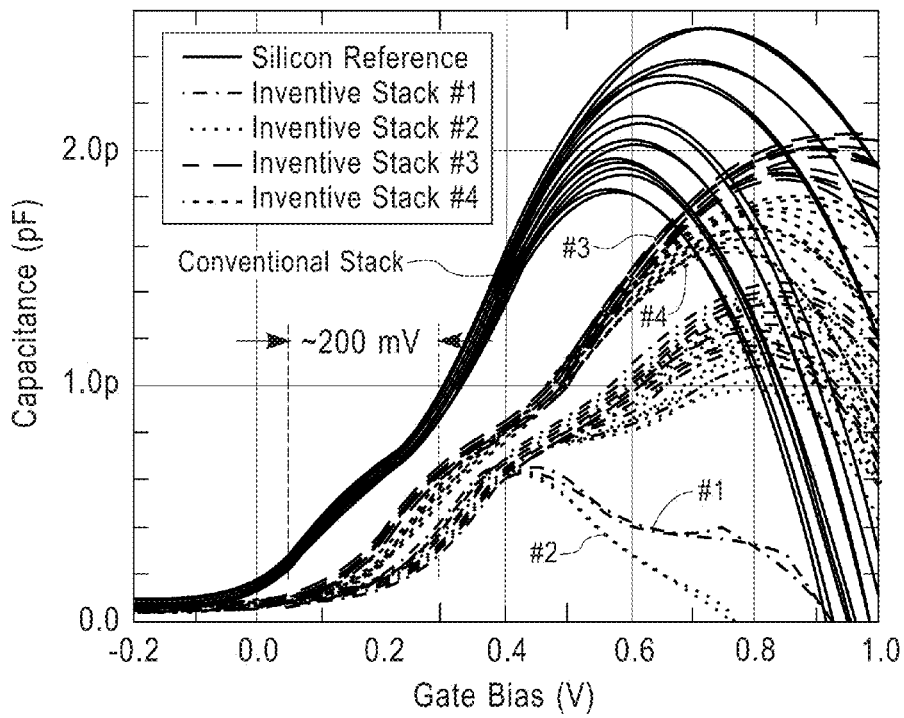
FIG. 14 is a graph plotting CV (capacitance vs. voltage) curves of various inventive material stacks shifted towards the p-FET band edge compared to a reference stack without the inventive stack.

FIG. 14 shows an example of capacitance vs. voltage (CV) curves of various inventive material stacks compared to a conventional material stack in p-FET devices.

The following example is provided for illustrative purposes and thus it should not be construed to limit the scope of the present invention.

EXAMPLE

In this example, p-FET devices were formed utilizing inventive material stacks #1 through #4, according to an exemplary embodiment of the present invention, and compared with a conventional p-FET device which did not include the inventive material stack. Specifically, the inventive material stacks #1 through #4 according to an exemplary embodiment as shown in FIG. 8, for example, were prepared using the processing steps shown in FIGS. 1A-1H, and the conventional p-FET device, not including the inventive material stack was prepared. Specifically, the material stack of the conventional p-FET device included a silicon substrate, a chemox layer, a high-k dielectric, an electrically conductive layer and a polysilicon gate conductor layer. As shown in FIG. 14, moving from left to right along the graph, the threshold voltage for the p-FET device is lower for the inventive material stacks #1 through 4. In the current example, the inventive material stack #1 provides a shift of approximately 200 mV, for example. The inventive material stacks #1 through #4 vary based on thicknesses of the Ge material layer, the anneal process temperatures for each inventive material stack and the position of the Ge material layer within the respective inventive material stack, for example. Irrespective of the differences between the inventive material stacks #1 through #4, there is a positive shift in the flatband voltage towards the pFET band-edge which is a characteristic of the threshold voltage, for the inventive material stacks #1 through #4. The correlation between the thickness and location of the Ge material layer and the shift in flatband voltage of the p-FET device will now be described below with reference to FIG. 15.

Figure 15:
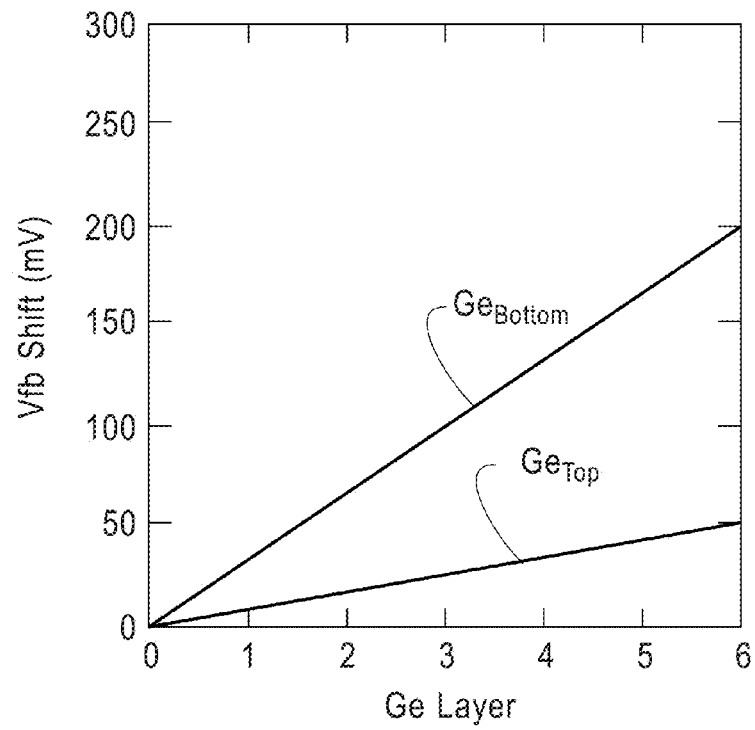
FIG. 15 is a graph plotting flatband voltage vs. parameters (i.e., thickness and location) of the inventive material stack that can be implemented within embodiments of the present invention.

As shown in FIG. 15, the shift in flatband voltage of the p-FET device is in direct correlation with the thickness and location of the Ge material layer within the gate stack of the p-FET device. That is, as shown in FIG. 15, when the thickness of the Ge material layer increases, the shift increases. Further, as shown in FIG. 15, there is a larger flatband voltage shift towards the p-FET band edge when the Ge material layer is disposed beneath the high-k dielectric (as denoted by $Ge_{BOTTOM}$) compared to when the Ge material layer is disposed on top of the high-k dielectric (as denoted by $Ge_{TOP}$).

Figure 16:
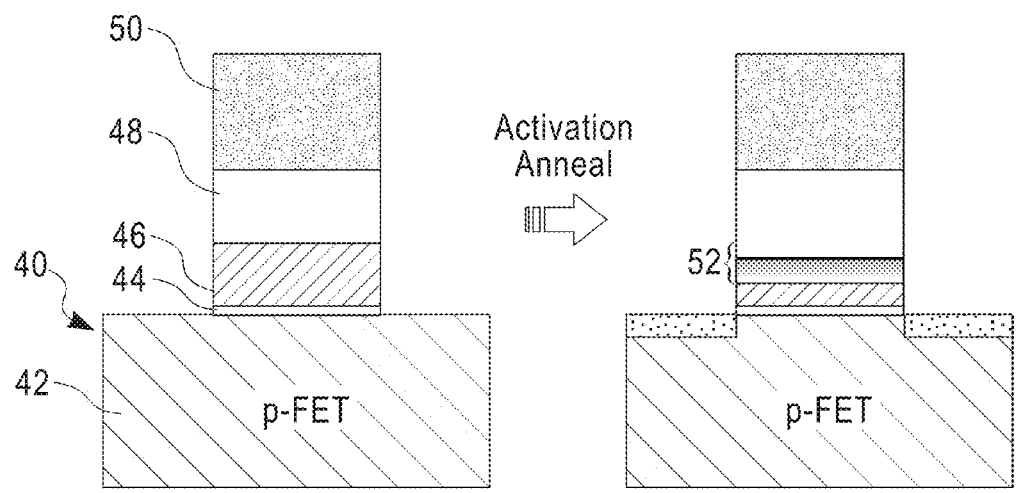
FIG. 16 is a cross-sectional view of a pictorial representation illustrating the diffusion of Ge-containing metal electrode of a gate stack structure that can be implemented within alternative embodiments of the present invention.

FIG. 16 illustrates a gate stack structure including a p-FET device including a Ge-containing metal electrode that can be implemented within alternative embodiments of the present invention. As shown in FIG. 16, the p-FET device 40 is formed by a semiconductor substrate 42, an interface preparation layer 44 is disposed on the semiconductor substrate 42 such as silicon, a high-k dielectric 46 is disposed on the interface preparation layer 44, a Ge-containing metal electrode 48 formed on top of the high-k dielectric 46, and a conductive layer 50 such as a Si-containing conductor including polysilicon may be disposed on top of the Ge-containing metal electrode 48. According to an exemplary embodiment, the Ge-containing metal electrode 48 includes MGe (where M denotes any conductive metal electrode material) such as titanium germanium nitride (TiGeN) or tantalum germanium carbon (TaGeC), for example. A diffusion region 52 is formed in the gate stack structure by an annealing process, thereby creating a shift in the threshold voltage.

The present invention implements a Ge or Ge compound material layer or other materials that shift in the p-FET direction, at specific locations within a gate stack structure, e.g., at an interface of the high-k dielectric, at a high-k metal electrode interface of a transistor, thereby obtaining desired flatband and threshold voltages.

Further, the presence of the material stack according to embodiments of the present invention may be determined by analytical techniques such as secondary ion mass spectroscopy (SIMS), electron energy loss spectroscopy (EELS), medium energy ion scattering (MEIS), X-ray photoelectron spectroscopy (XPS), and Rutherford back scattering (RBS), for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A material stack formed on a semiconductor substrate of a semiconductor structure having first and second regions, comprising:
    an interface preparation layer formed on the semiconductor substrate, in both the first and second regions;
    a high-k dielectric layer having a high dielectric constant greater than approximately 3.9, the high-k dielectric layer present over both the first and the second regions, wherein the high-k dielectric layer is formed directly on the interface preparation layer in the second region;
    a germanium (Ge) material layer formed only in the first region, wherein the Ge material layer is formed directly on the interface preparation layer in the first region and the high-k dielectric layer is formed directly on the Ge material layer in the first region;
    a metal nitride layer formed only in the second region, wherein the metal nitride layer is formed directly on the high-k dielectric layer in the second region; and
    a conductive electrode layer formed over both the first and the second regions.

2. The material stack of claim 1, further comprising a conductive layer disposed on top of the conductive electrode layer, the conductive layer present over both the first and the second regions.

3. The material stack of claim 2, wherein the conductive layer comprises one of a Si-containing conductive layer or a metallic conductive layer.

4. The material stack of claim 1, wherein the interface preparation layer comprises a chemical oxide, a thermal oxide or an oxynitride layer.

5. The material stack of claim 1, wherein the Ge material layer comprises Ge or a Ge compound.

6. The material stack of claim 1, wherein a thickness of the Ge material layer is less than or equal to approximately 2 nanometers (nm).

7. A semiconductor structure, comprising:
- a patterned material stack disposed on a surface of a semiconductor substrate, the patterned material stack comprising:
- an interface preparation layer formed on the semiconductor substrate;
- a high-k dielectric layer having a high dielectric constant greater than approximately 3.9, the high-k dielectric layer formed on the interface preparation layer; and
- a germanium (Ge)-containing metal electrode formed on the high-k dielectric layer, wherein the Ge-containing metal electrode comprises MGe where M denotes a conductive metal electrode material selected from the group consisting of titanium germanium nitride (TiGeN) and tantalum germanium carbon (TaGeC).

8. A method of forming a semiconductor structure having a first semiconductor device including a first patterned material stack and a second semiconductor device including a second patterned material stack, the method comprising:
- providing a semiconductor substrate, the first patterned material stack formed over a first region of the substrate and the second patterned material stack formed over a second region of the substrate;
- forming an interface preparation layer in the first and second patterned material stacks;
- forming a metal nitride layer on the interface preparation layer of only the first patterned material stack;
- forming a high-k dielectric layer, having a high dielectric constant greater than approximately 3.9, on the metal nitride layer of the first patterned material stack, and on the interface preparation layer of the second patterned material stack;
- forming a Ge material layer on the high-k dielectric of both the first and second patterned material stacks; and
- forming a conductive electrode layer above the Ge material layer of both the first and second patterned material stacks.

9. A method of forming a semiconductor structure having a first semiconductor device including a first patterned material stack and a second semiconductor device including a second patterned material stack, the method comprising:
- providing a semiconductor substrate, the first patterned material stack formed over a first region of the substrate and the second patterned material stack formed over a second region of the substrate;
- forming a high-k dielectric having a high dielectric constant greater than approximately 3.9;
- forming a metal nitride layer in the first patterned material stack interfacing with the high-k dielectric;
- forming a Ge material layer only in the second patterned material stack interfacing with the high-k dielectric;
- forming a conductive electrode layer above the high-k dielectric, the Ge material layer, or the metal nitride layer; and
- forming the metal nitride layer in the second patterned material stack interfacing with the high-k-dielectric.

* * * * *